United States Patent
Huang et al.

(10) Patent No.: US 10,303,823 B2
(45) Date of Patent: May 28, 2019

(54) DEFECT DETECTION METHOD FOR 3D CHIP AND SYSTEM USING THE SAME

(71) Applicant: I-SHOU UNIVERSITY, Kaohsiung (TW)

(72) Inventors: Yu-Jung Huang, Kaohsiung (TW); Chung-Long Pan, Kaohsiung (TW); Shih-Chun Lin, Kaohsiung (TW); Mei-Hui Guo, Kaohsiung (TW)

(73) Assignee: I-SHOU UNIVERSITY, Kaohsiung (TW)

( * ) Notice: Subject to any disclaimer, the term of this patent is extended or adjusted under 35 U.S.C. 154(b) by 65 days.

(21) Appl. No.: 15/604,671

(22) Filed: May 25, 2017

(65) Prior Publication Data

US 2018/0285493 A1   Oct. 4, 2018

(30) Foreign Application Priority Data

Mar. 30, 2017   (TW) .............................. 106110815 A

(51) Int. Cl.
*G06F 17/50* (2006.01)
*G06N 20/00* (2019.01)

(52) U.S. Cl.
CPC ...... *G06F 17/5009* (2013.01); *G06F 17/5081* (2013.01); *G06N 20/00* (2019.01)

(58) Field of Classification Search
CPC ............ G06F 17/5009; G06F 17/5081; G06N 99/005; G06N 20/00
See application file for complete search history.

(56) References Cited

U.S. PATENT DOCUMENTS

| | | |
|---|---|---|
| 9,239,359 B2 | 1/2016 | Marinissen et al. |
| 2014/0062586 A1 | 3/2014 | Shih et al. |
| 2014/0376324 A1 | 12/2014 | Vogelsang et al. |

FOREIGN PATENT DOCUMENTS

| | | |
|---|---|---|
| CN | 102687263 | 9/2012 |
| JP | 2008091902 | 4/2008 |
| TW | 200622275 | 7/2006 |

(Continued)

OTHER PUBLICATIONS

Brandon Noia, "Design-for-Test and Test Optimization Techniques for TSV-based 3D Stacked ICs," PhD Thesis, Department of Electrical and Computer at Duke University, 2014, pp. 1-233.

(Continued)

*Primary Examiner* — Stacy Whitmore
(74) *Attorney, Agent, or Firm* — JCIPRNET

(57) ABSTRACT

A defect detection method for a 3D chip and a system using the same are provided. The method includes: generating a plurality of physical models having a defect of at least one defect type based on the at least one defect type of a 3D chip; generating a group of training samples for each of the physical models; generating a classifier model by using a machine learning technique algorithm via scattering parameter values of a training set; measuring an error value by comparing scattering parameter values of a testing set with the classifier model, using the classifier model as a defect model of the defect type based on the error value, and determining that a Through Silicon Via of a single die 3D chip or a stacked die 3D chip has a defect corresponding to the at least one defect type by comparing actual measurements of scattering parameter values.

16 Claims, 15 Drawing Sheets

(56) References Cited

FOREIGN PATENT DOCUMENTS

TW    I530701    4/2016

OTHER PUBLICATIONS

Daniel H. Jung, et al., "Modeling and Analysis of High-Speed Through Silicon via (TSV) Channel and Defects," 2016 IEEE International Symposium on Electromagnetic Compatibility (EMC), Jul. 25-29, 2016, pp. 430-433.

Thuy T.T. Nguyen, et al., "A Survey of Techniques for Internet Traffic Classification using Machine Learning," IEEE Communications Surveys & Tutorials, vol. 10, No. 4, Fourth Quarter 2008, pp. 56-76.

Gian Antonio Susto, et al., "Automatic Control and Machine Learning for Semiconductor Manufacturing: Review and Challenges," The 10th European Workshop on Advanced Control and Diagnosis (ACD 2012), Technical University of Denmark, Kgs. Lyngby, Denmark, Nov. 8-9, 2012, pp. 1-8.

Chukwudi Okoro, et al., "Accelerated Stress Test Assessment of Through-Silicon via Using RF Signals," IEEE Transactions on Electron Devices, vol. 60, No. 6, Jun. 2013, pp. 2015-2021.

Chukwudi Okoro, et al., "Elimination of the Axial Deformation Problem of Cu-TSV in 3D Integration," AIP Conference Proceedings, vol. 1300, Nov. 2010, pp. 214-220.

Joohee Kim, et al., "High-Frequency Through-Silicon via (TSV) Failure Analysis," 2011 IEEE 20th Conference on Electrical Performance of Electronic Packaging and Systems (EPEPS), Oct. 23-26, 2011, pp. 243-246.

Ron Kohavi et al., "A Study of Cross-Validation and Bootstrap for Accuracy Estimation and Model Selection," IJCAI'95 Proceedings of the 14th international joint conference on Artificial intelligence, vol. 2, Aug. 20-25, 1995, pp. 1137-1143.

Gérard Biau, "Analysis of a Random Forests Model," Journal of Machine Learning Research, vol. 13, Jan. 2012, pp. 1063-1095.

Chung-Long Pan, et al., English Abstract of "Electrical Fault Detection for 3D Interconnects," and the time table of 15th International Symposium on Microelectronics and Packaging (ISMP 2016), Oct. 26-28, 2016, pp. 1-4.

Yu-Jung Huang, et al., "Defect Detection for 3D Through Silicon via Based on Machine Learning Approach," Nanoscience and Nanotechnology Letters, vol. 9, No. 8, Aug. 2017, pp. 1175-1179.

Yu-Jung Huang et al., "Machine-Learning Approach in Detection and Classification for Defects in TSV-Based 3-D IC", IEEE Transactions on Components, Packaging and Manufacturing Technology, Jan. 30, 2018, pp. 1-8.

DEFECT DETECTION METHOD FOR 3D CHIP AND SYSTEM USING THE SAME

CROSS-REFERENCE TO RELATED APPLICATION

This application claims the priority benefit of Taiwan application serial no. 106110815, filed on Mar. 30, 2017. The entirety of the above-mentioned patent application is hereby incorporated by reference herein and made a part of this specification.

BACKGROUND OF THE INVENTION

Field of the Invention

The invention relates to a detection method and a system, and more particularly, to a defect detection method for a 3D chip and a system using the same.

Description of Related Art

Compared to a traditional 2D chip, a three-dimension (3D) chip stacking technique has many advantages. For instance, adopting a 3D stacking method can significantly increase system integration, reduce package body size and weight, increase package density, and reduce form factor, such that more components can be accommodated in a unit volume of an integrated circuit. Moreover, via heterogeneous integration, chips of various different processes and operation characteristics can be stacked. For instance, modules of various different functions such as analog, RF, and logic circuits can be grouped together via a 3D stacking technique to significantly increase system performance.

For 3D chips connected by a vertical Through Silicon Via (TSV) technique, the TSV can significantly increase the number of connections between two layers of chips. By achieving vertical interconnection communication between layers, the connection length in an integrated circuit can be effectively reduced. Since reduced connection length is equivalent to reduced parasitic resistance and capacitance in connection, time constant signal delay is reduced, such that signal transmission rate is increased and the bandwidth of data transmission is increased, and the issue of limited data bandwidth in the past is effectively solved.

In a 3D stacking system, interconnect is generally a very important infrastructure dominating signal transmission quality, but as the size of the 3D chip continues to be smaller, the potential threat of system failure caused by connection failure is also becoming more significant. Therefore, the detection method of the TSV itself depends on the quality of system miniaturization and the cost thereof, and is an important link deserving attention. Many issues and challenges of the 3D chip stacking process are related to test, such as a large portion of the high manufacturing cost of the TSV is used for test, and not every manufactured TSV can be applied in a chip circuit. If defective TSV is not detected and is used in the stacking with other chips, then the entire stacking system is flawed. Based on the above, the development of a reliable, high-efficiency TSV detection theory and method is very important for the application of 3D chip stacking.

Since the 3D chip is formed by stacking many different dies, the 3D chip is more complex than a 2D chip in the detection process, and therefore new issues and challenges are raised in the detection process. The forming of bumps of the 3D structure or the detection of TSV conductivity performance cannot be achieved by detecting using a probe. TSV techniques include via drilling, via wall isolation, and via filling, and usually require processes such as a thinning treatment and polishing, and TSV defects are readily generated in these processes. For instance, a pinhole on the TSV insulator or a void defect generated in a filling process. Moreover, since bumps need to be stacked in the 3D structure in the process of a 3D chip bonding and stacking technique, the resulting stress readily generates bump cracks. Moreover, in the stacking of 3D chips, the TSV between each layer of chips and the signal of the metal bumps need to achieve accurate alignment, and if accurate alignment and bonding cannot be achieved in the 3D chips stacked by a plurality layer of chips, then signal transmission is distorted. The issues above such as defects, bump cracks, or misaligned TSV all affect the performance of the device and the overall system, and also cause failure to the entire system chip or system package, and therefore the yield of 3D chip production is affected. Therefore, the effective detection of whether the TSV is capable of normal operation is a relatively important object in the 3D integrated circuit design. Currently, the testing process for 3D chips can be divided into pre-bond test, midbond test (partial stack testing), and post-bond test, wherein the post-bond test, partial stacking test, TSV complete stacking test, and TSV redistribution layer (RDL) test, wherein situations such as failure caused by short circuits, open circuits, and defects need to be considered for the pre-bond detection of the TSV, and circuit failures caused by, for instance, defects generated in a post-bond process need to be detected by a post-bond detection technique. The quantity of the TSV is directly related to the reliability of the 3D chip. An excess number of TSV readily causes transmission signals to interfere with one another. Moreover, the area of each of the TSV plus the area of the surrounding Design-For-Test circuit often prevent the overall chip layout area from being optimized such that costs are increased and function is reduced.

For the test of TSV channel function, in addition to the test of each single die chip, the development of a testing method across the signal between each layer of chips is also needed. Currently, a specific standard method testing TSV channel function in a stacked die 3D chip does not exist. However, in response to the large demand for the defect detection of advanced IC and quality reliability of the product, in addition to achieving the effectiveness of basic detection function, the testing theory needs to be improved and the structure of testing process needs to be enhanced to reduce the costs of detection and the chip manufacture process. Accordingly, the development of a TSV testing technique is one of the important factors for the breakthrough in stacked die 3D application promotion.

For stacked die 3D chip test, since when the circuit is divided into a plurality of layers, the issue of difficult test occurs, such as each layer lacks complete testing function, an effective method to perform functional test for single-layer and multilayer TSVs still cannot be found. To solve this issue, design for test methods such as a logic built-in self-test (BIST) or scan circuit . . . etc. are also often applied in stacked die 3D chip test, wherein the connection testing technique of interlayer stacked die 3D chip TSV is a great challenge in test. For instance, when the circuit is divided into a plurality of layers, a single chip itself does not have external input/output contacts, and electrostatic protection device (ESD) protection is also absent, and therefore many difficulties arise in test. Since each layer of chips contains many TSVs, in particular certain chips with higher bandwidth requirements, the number of interlayer TSVs thereof is large and the transmission path is complex, and therefore how to generate a defect model of the TSV and an effective TSV testing method to ensure the normal operation of the TSVs is also a major issue in TSV test that needs to be solved. Moreover, the interconnected chips of a plurality layer of TSVs require a grinding treatment, but defects of the chips caused during the grinding treatment are not readily observed, and therefore chips having defects are often implanted in a subsequent stacking treatment by mistake. Based on the above, performing an interlayer connection structure test further explores the defect relationship of signal connection transmission quality and a multilayer connection structure, and is an important research topic for improving 3D chip integrated system function.

SUMMARY OF THE INVENTION

The invention provides a defect detection method for a 3D chip and a system using the same that can classify a 3D chip based on different defect types without performing an additional Design-For-Test circuit design and without sample preparing for observing the presence of defects.

An embodiment of the invention provides a defect detection method for a single die 3D chip and a stacked die 3D chip, the method including: generating a plurality of physical models having a defect of at least one defect type based on the at least one defect type of a 3D chip; generating a group of training samples for each of the physical models to form a training sample group and dividing the training sample group into a training set and a testing set; obtaining a group of scattering parameter values corresponding to the training set via the training set; generating a classifier model via the group of scattering parameter values; and measuring an error value of the classifier model using the testing set and using the classifier model as a defect model of the at least one defect type based on the error value to determine that a Through Silicon Via (TSV) of a single die 3D chip or a stacked die 3D chip has a defect corresponding to the at least one defect type.

An embodiment of the invention provides a defect detection system for a single die 3D chip and a stacked die 3D chip, the system including: a physical model generating module, a training sample generating module, a scattering parameter value acquisition module, a classifier model generating module, and a defect model generating module. The physical model generating module generates a plurality of physical models having a defect of at least one defect type based on the at least one defect type of a 3D chip. The training sample generating module generates a group of training samples corresponding to a physical model for each of the physical models to form a training sample set and divides the training sample group into a training set and a testing set. The scattering parameter value acquisition module obtains a group of scattering parameter values corresponding to the training set via the training set. The classifier model generating module generates a classifier model via the group of scattering parameter values. The defect model generating module measures an error value of the classifier model using the testing set and uses the classifier model as a defect model of the at least one defect type based on the error value to determine that a TSV of a single die 3D chip or a stacked die 3D chip has a defect corresponding to the at least one defect type.

Based on the above, the invention provides a defect detection method for a 3D chip and a system using the same that can improve the defect detection and detection process algorithm for a stacked die 3D chip using a machine learning technique. Accordingly, in the invention, a 3D chip can be classified based on different defect types without performing an additional Design-For-Test circuit design and without sample preparing for observing the presence of defects.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Performing signal transmission using Through Silicon Via (TSV) in the vertical direction is a key technique for achieving vertical interconnection in a three-dimensional silicon-carbide integrated circuit (3D-SIC), i.e., 3D chip. Therefore, a complete 3D-SIC detection method and an effective detection design tool are an indispensable condition. In the invention, the defect detection and detection process of the 3D-SIC are studied using a machine learning technique algorithm to provide a corresponding detection structure design solution for a 3D-SIC application.

As the size of transistors continues to be smaller, nanometer-scale defects are more difficult to be detected, such that the performance of the device is affected and signal transmission distortion occurs as a result, and failure of the 3D chip also occurs, such that the reliability of the 3D chip is affected. The concept of the invention is to perform an electrical function simulation for a TSV defect model of 3D chips, and then build a classifier model related to the TSV defect via a machine learning algorithm by analyzing relevant simulation or quantitative data collected by different TSV defect types to generate a detection identification method of TSV defect types. Simulation data of defect samples is trained by a machine learning algorithm and data state classifiers of various types of TSV defects are selected and analyzed to generate a classifier model of various TSV defects. The classifier model can perform classifying based on whether the TSV state meets defect classifiers and classify the TSV to be detected by the classifier model to achieve detection performance of the TSV defect state. The motivation for the development of such research method is the early diagnosis, prevention, and treatment of TSV defect and failure, and even the system function can be determined beforehand. As a result, effective prediction and state evaluation are effectively, rapidly, and accurately achieved for TSV defects, and detection cost reduction and increased yield of chip stacking for a future system can be achieved.

Figure 1:
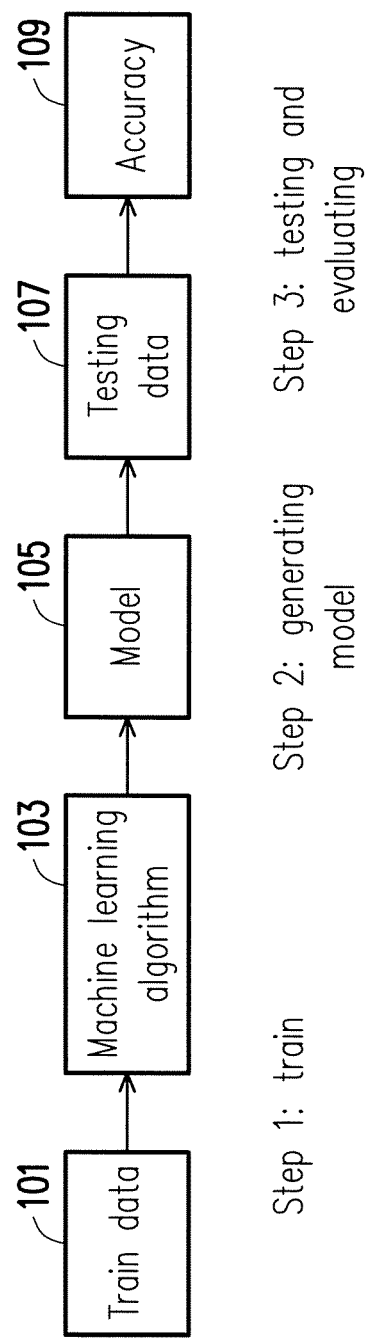
FIG. 1 shows a flowchart of a machine-learning technique-based 3D chip TSV defect detection according to an embodiment of the invention.

FIG. 1 shows a flowchart of a machine-learning technique-based 3D chip TSV defect detection according to an embodiment of the invention. When a machine learning technique is implemented, a group of training samples formed by an input subjects (quantity of classifiers) and an expected output value (also referred to as a label) is first generated. Next, the training samples can be analyzed by a learning algorithm and generate an inferred function, and when the output function is a discrete function, the inferred function can be referred to as a classifier, and when the output function is a continuous function, the inferred function can be referred to as a regression function.

Referring to FIG. 1, in step 1, data is collected based on the TSV defect state of the 3D chip, and then data generated by various potentially defective TSVs and the data of normal TSVs are inputted into a machine learning algorithm to perform training of the classifier model for classification. Then, in step 2, a trained classifier model is generated. Lastly, in step 3, the accuracy of TSV defect detection is verified using the trained classifier model.

The classifier model training algorithm used by the machine learning algorithm affects the accuracy of detection of the generated classifier model, and the classification performance is also affected by the classification characteristics of the selected data. If the selected classification characteristics can classify a group to be classified well, then the best classification performance is achieved. Moreover, the selected classification characteristics all need to be quantified into numeric values for input. The selection of the classification model training algorithm needs to adopt different classification model training algorithms based on different selected characteristics data, and the use of different classification model training algorithms can also affect the performance of classification. Since the data characteristics used in classifier model training and the algorithm used are predicted to have considerable correlation with the accuracy of detection, the 3D chip TSV defect detection method based on a machine learning technique provided by the invention is mainly related to the selection of the characteristics data selection method of the TSV defect state and the selection of the classification model training algorithm.

Figure 2:
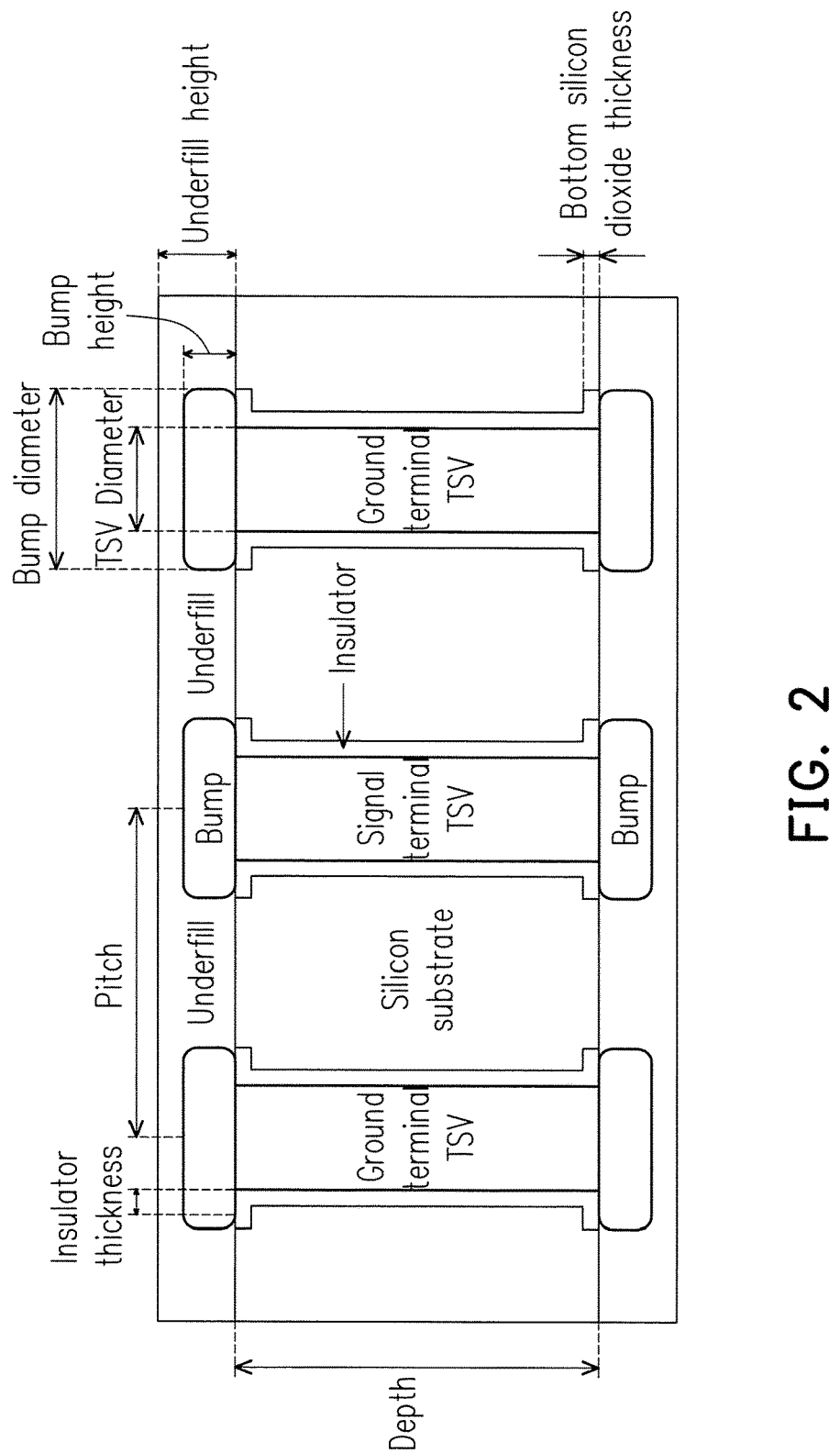
FIG. 2 shows a cross-sectional structure schematic diagram of a single-layer cylindrical TSV.
Figure 3A:
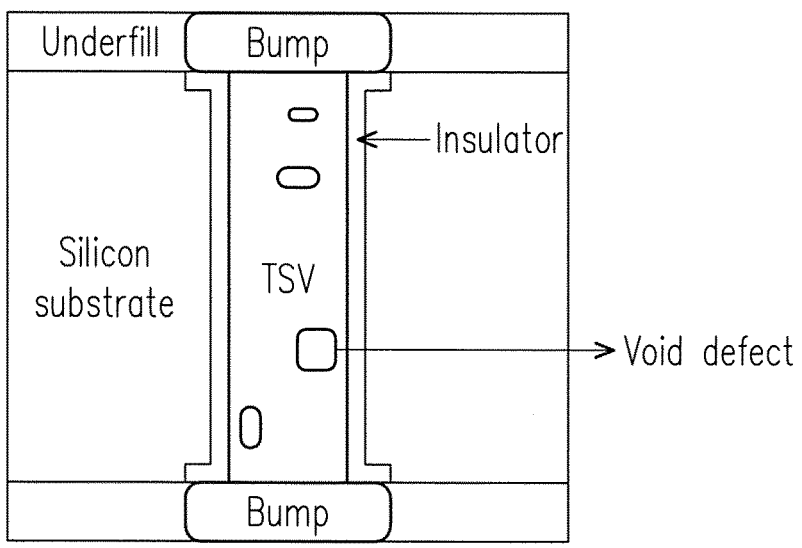
FIGS. 3A, 3B, 3C, and 3D show schematic diagrams of common TSV defects.
Figure 3B:
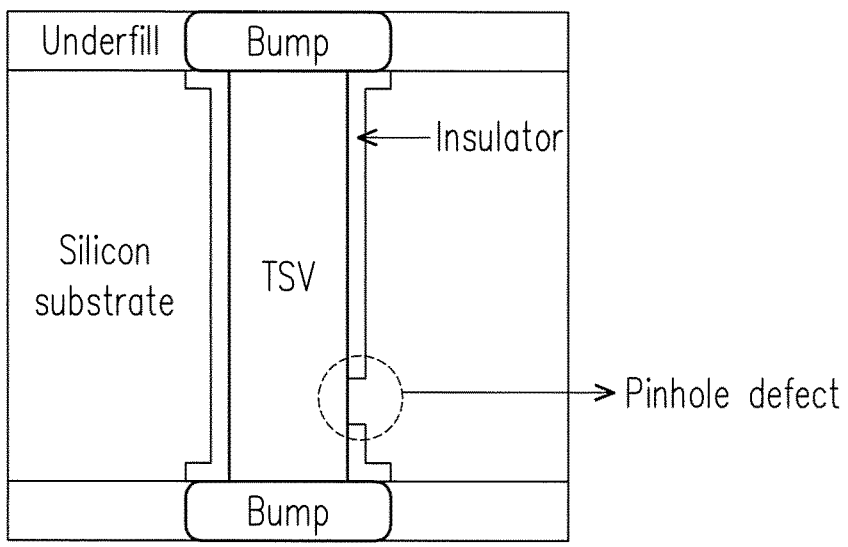
Figure 3C:
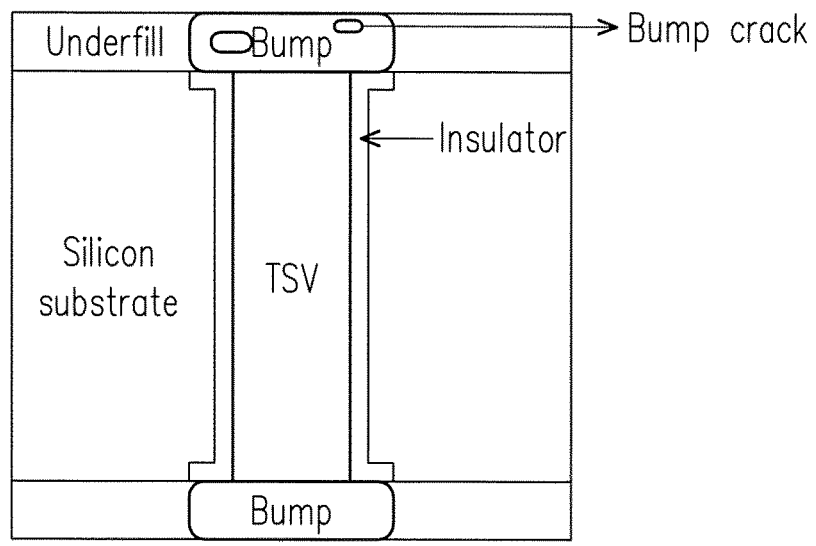
Figure 3D:
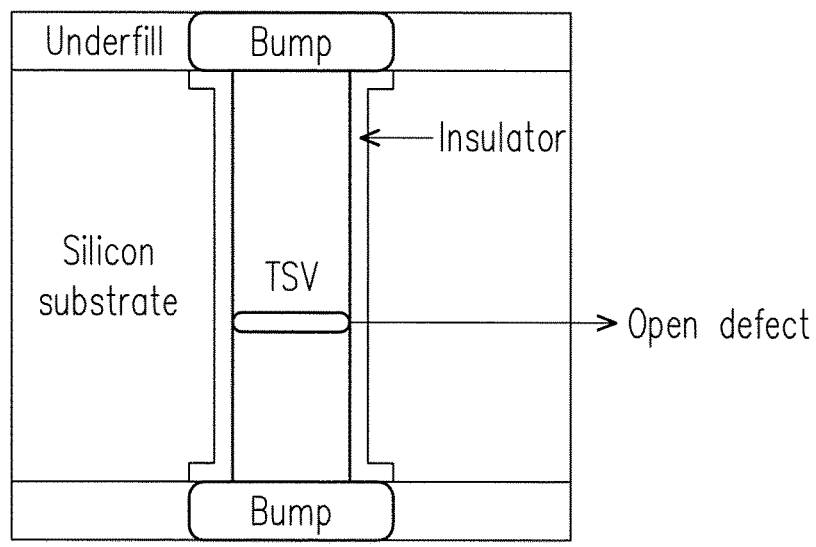
Figure 4A:
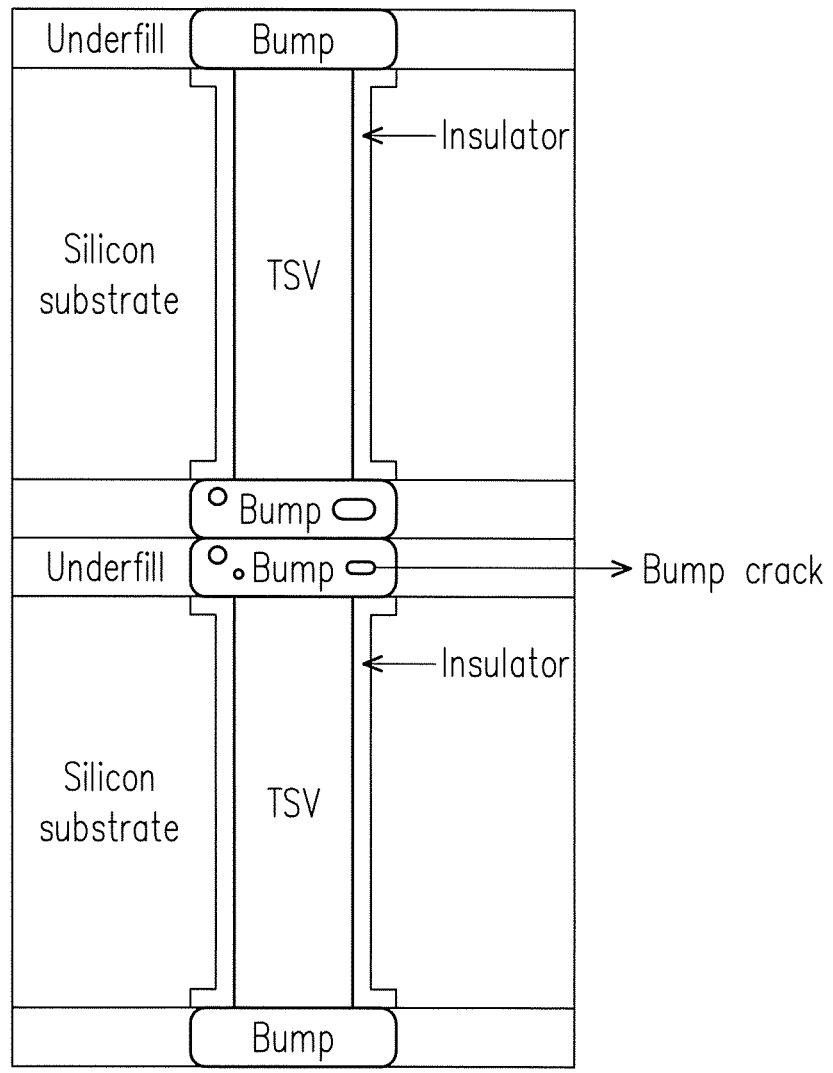
FIGS. 4A, 4B, 4C, and 4D show schematic diagrams of common TSV defects of stacked die 3D chips.
Figure 4B:
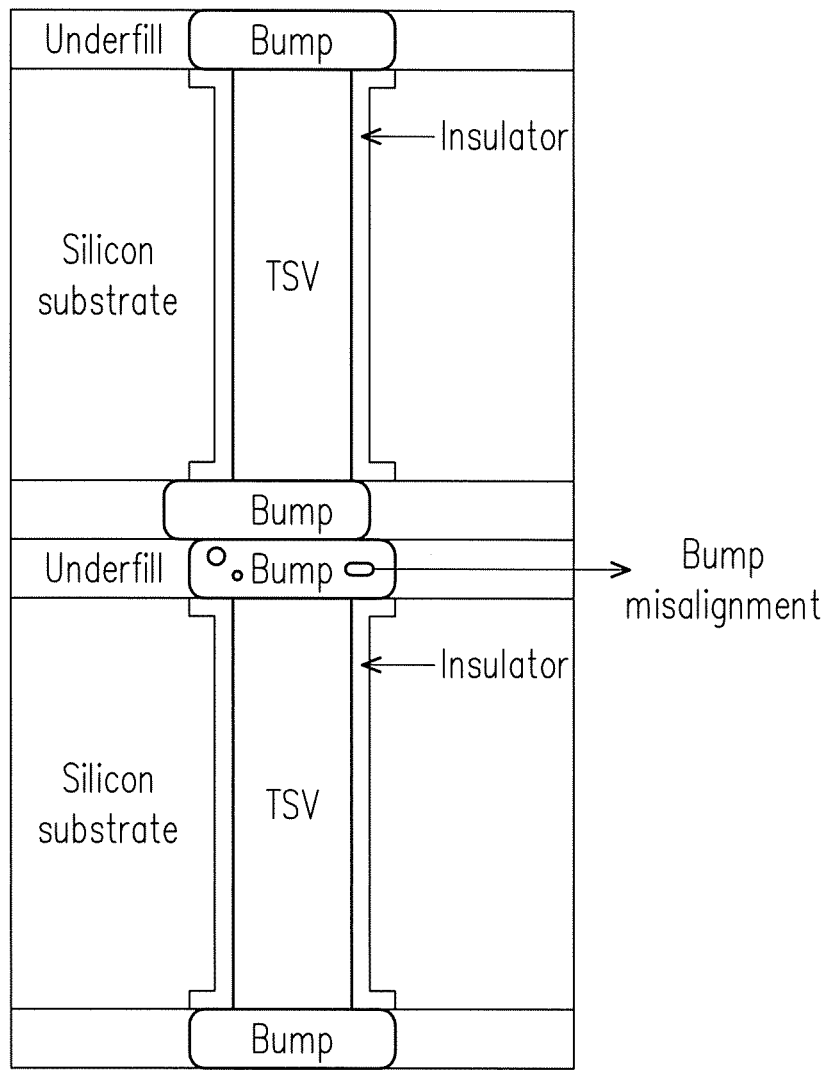
Figure 4C:
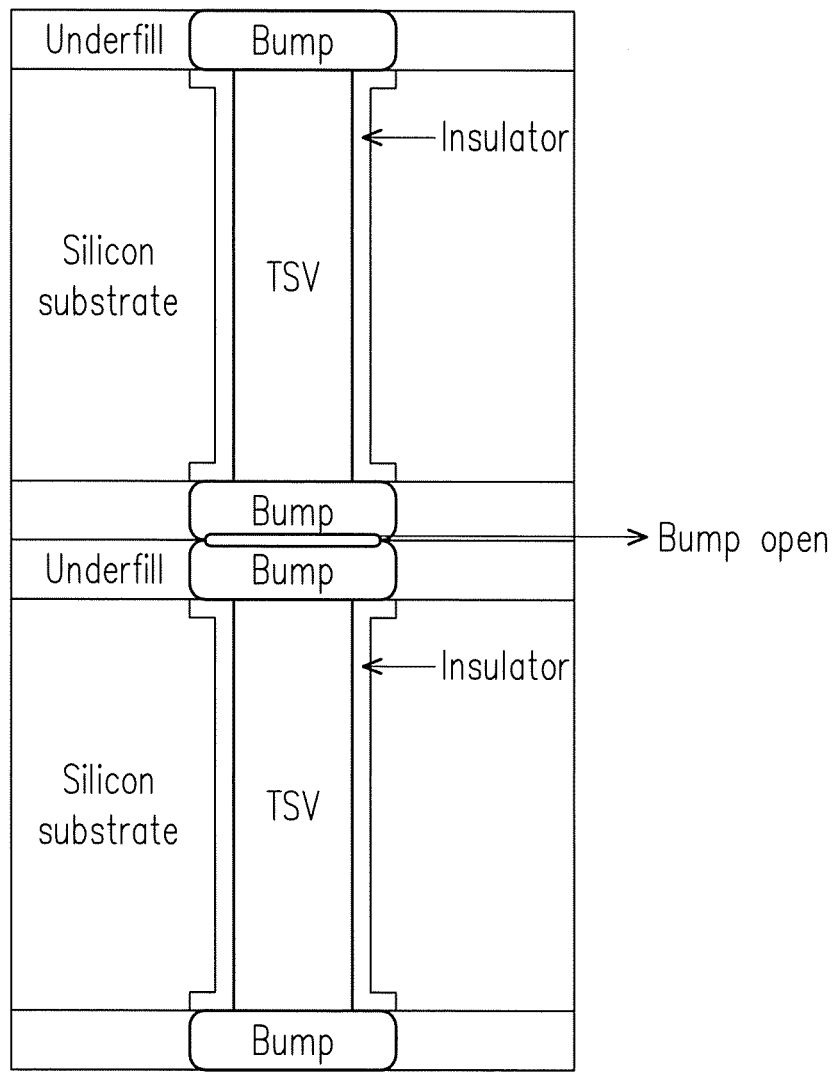
Figure 4D:
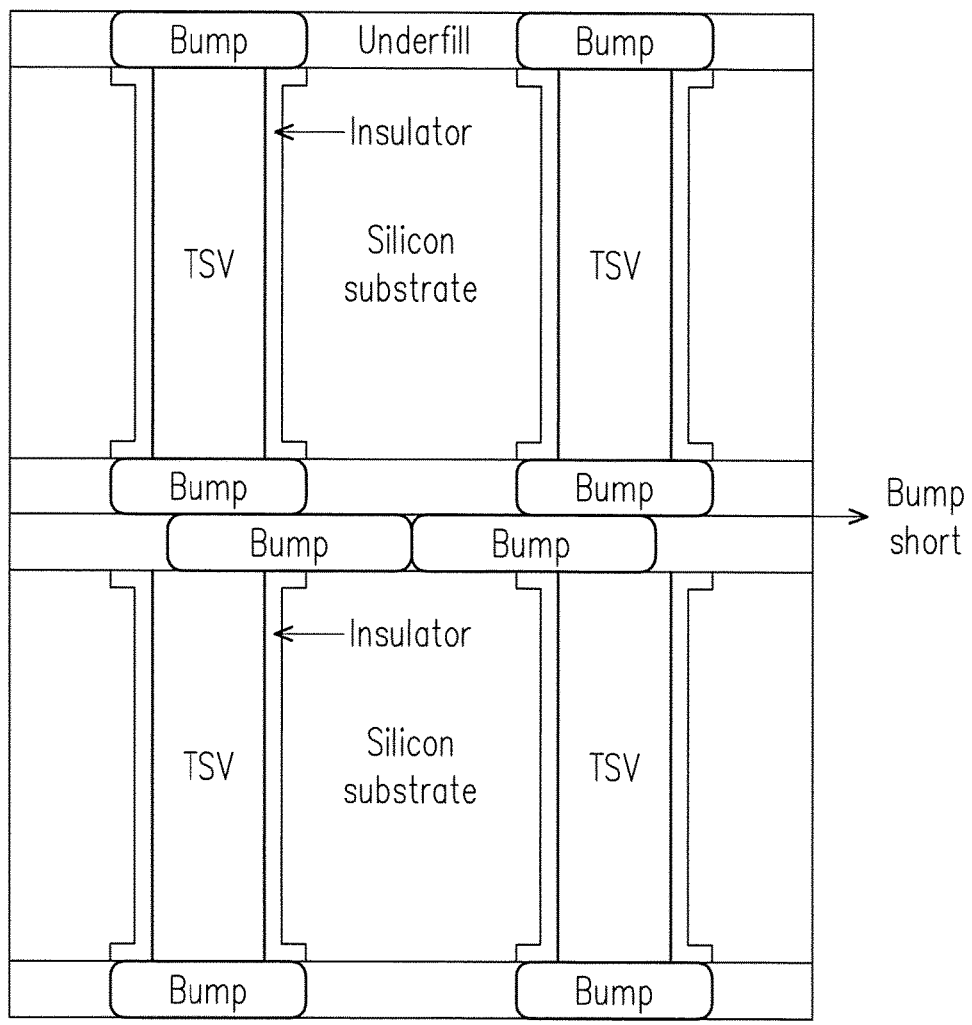

FIG. 2 shows a cross-sectional structure schematic diagram of a single-layer cylindrical TSV. The cylindrical TSV is the most common TSV structure. In the case of FIG. 2, the cross-sectional structural schematic diagram shown in FIG. 2 is shown in ground signal ground (GSG) configuration. In the structure, through holes are etched on a silicon substrate and metal is filled to form a TSV, and a silicon dioxide is formed around the TSV to isolate the silicon substrate. The TSV and the metal connect are connected by a bump, and the bump is generally the same type as the TSV filler metal. The resulting TSV product often has different types of defects, and FIGS. 3A, 3B, 3C, and 3D show schematic diagrams of common TSV defects. In the TSV manufacturing process, several types of defects often occur. For instance, FIG. 3A shows the generation of void defects due to incomplete deposition and filling of through hole metal, and FIG. 3B shows the sidewall insulator of the TSV has pinhole defects due to an effect from process parameters, such that the TSV and the silicon substrate are connected to form wrong paths, such that circuit failure occurs. The two defects above readily cause leakage fault. Another case is that metal breakage or void occurs during metal filling of the TSV, such as the bump crack shown in FIG. 3C and the open defect shown in FIG. 3D. Such defects result in the partial or complete blockage of the signal channel passing through the TSV, thus causing circuit failure. The circuit failure caused by such defects is referred to as open fault failure of the TSV.

In addition to the generation of defects of the TSV of the single die 3D chip during the manufacturing process, other types of defects also occur when the chips of the single die 3D chip TSV are stacked into stacked die 3D chip TSV. FIGS. 4A, 4B, 4C, and 4D show schematic diagrams of common TSV defects of stacked die 3D chips. Stacking TSV having defects and bumps results in failure or reduced function of the entire 3D stacked chips. When the chips are stacked, as the number of stacked chips is increased, the failure of the TSV causes the yield loss of the chips to increase exponentially. Therefore, to reduce stacking yield loss, a pre-bond test needs to be performed on the TSV before the chips are stacked to exclude defective TSV. Next, to increase the stacking yield of the chips, a post-bond test needs to be performed on the TSV after the chips are stacked. During the multilayer stacking of the TSV of the 3D chips, a bump defect may be generated. Common bump defects are, for instance, the bump crack shown in FIG. 4A, the bump misalignment shown in FIG. 4B, the bump open shown in FIG. 4C, and the bump short fault shown in FIG. 4D.

Figure 5:
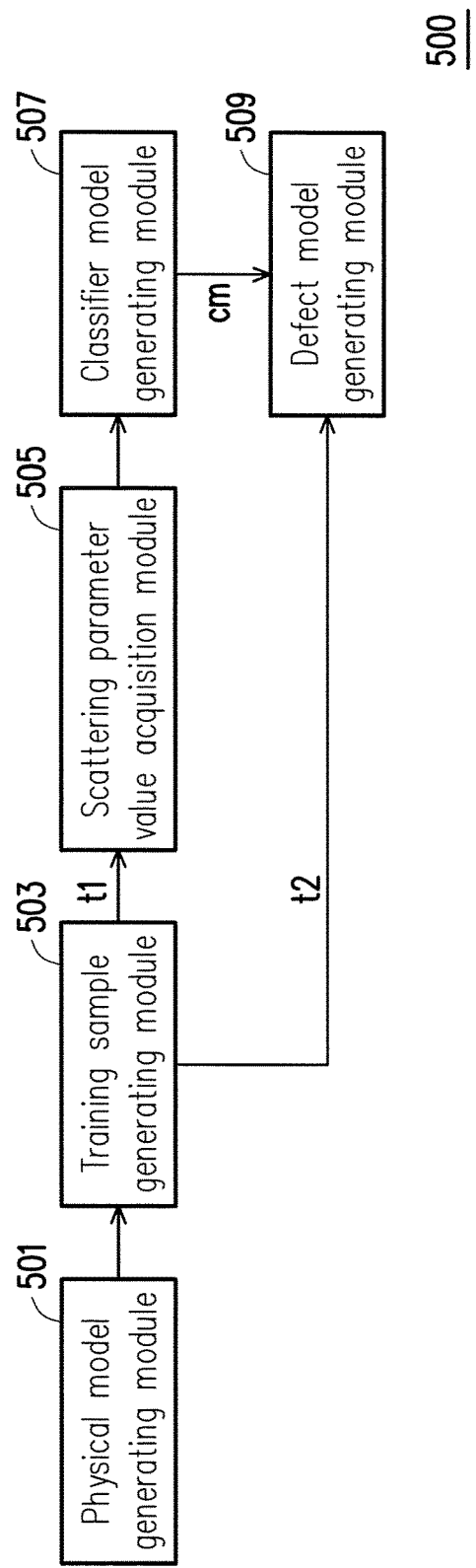
FIG. 5 shows a defect detection system for a single die 3D chip and a stacked die 3D chip according to an embodiment of the invention.

FIG. 5 shows a defect detection system 500 for a single die 3D chip and a stacked die 3D chip according to an embodiment of the invention. The defect detection system 500 can include a physical model generating module 501, a training sample generating module 503, a scattering parameter value acquisition module 505, a classifier model generating module 507, and a defect model generating module 509. The physical model generating module 501, the training sample generating module 503, the scattering parameter value acquisition module 505, the classifier model generating module 507, and the defect model generating module 509 can be, for instance, disposed in a computer to execute the method disclosed by the invention, and the invention is not limited in this regard.

The physical model generating module 501 can generate a plurality of physical models having a defect of at least one defect type based on the at least one defect type of a 3D chip. Specifically, the physical model generating module 501 can generate a TSV physical model having the defect of the defect type shown in FIGS. 3A to 3D and FIGS. 4A to 4D using a 3D full-wave solver such as a high-frequency structure simulator (HFSS). The physical model generating module 501 can generate a plurality of physical models corresponding to only a defect type for the defect type, and can also generate a plurality of physical models corresponding to the plurality of defect types for a plurality of defect types.

In the case of the void defects and pinhole defects of a single die 3D chip TSV, if the user is to detect whether the single die 3D chip has void defects or pinhole defects, or is to further detect the degree to which the void defects or pinhole defects of the TSV in the single die 3D chip occur, then the user can generate a plurality of physical models having different degrees of void defects and pinhole defects using HFSS, such as generate a plurality of physical models of the TSV respectively for 0%, 5%, . . . , 60% of void defects and generate a plurality of physical models of the TSV respectively for 0%, 5%, . . . , 60% of pinhole defects. In the case of a void defect of the TSV, the degree to which the void defect occurs can be determined by the following formula:

$$e = \frac{V_{void}}{V_{tsv}}$$

wherein e is the void defect ratio of the TSV, $V_{void}$ is the volume of the void, and $V_{tsv}$ is the volume of the TSV.

In an embodiment of the invention, a corresponding classifier model can lastly be generated based on the plurality of physical models to determine whether the 3D chips have the same type of defect as the physical models, or the degree to which the defect occurs. It should be mentioned that, when the physical models are generated, the user can generate corresponding physical models for a single defect type and can also generate corresponding physical models for a plurality of defect types. Moreover, the defect type of the TSV is also not limited to the defect types shown in FIGS. 3A to 3D and FIG. 4A to FIG. 4D, and the user can decide what defect type of the TSV the generated physical models have based on actual requirement, and the invention is not limited in this regard. Moreover, the physical models can have the configuration of a single die 3D chip and can also have the configuration of a stacked die 3D chip.

When the physical model of the TSV corresponding to a specific defect type is generated using HFSS, the physical model generating module 501 can use HFSS and generate the physical model based on the structure parameter group of HFSS, wherein the structure parameter group can include one or a plurality of different structural parameters. The structure parameter group can include at least one parameter of a TSV diameter, a TSV pitch, a TSV depth, a TSV aspect ratio, an underfill height, a relative permittivity of an underfill, a bonding overlay accuracy, a contact pitch when thermocompression is used, a contact pitch when a solder bump is used, a bump diameter, a bump height, a number of die per stack, an bottom silicon dioxide thickness, and a TSV insulator thickness. The TSV can be designed and implemented by filling different materials such as copper and tungsten and structural parameters, and therefore the physical model of the TSV can also be generated by collecting various types of corresponding signal transmission characteristic data based on different transmission characteristic requirements. Moreover, the selection of the structural parameters can be based on the specification recommended by the ITRS 3D-SIC/3D-SOC Roadmap. Table 1 shows the recommended settings of several structural parameter values. When the physical model of the TSV corresponding to a specific defect type is generated using HFSS, the user can decide how to set the structural parameters of the HFSS based on actual requirement, and the invention is not limited in this regard.

TABLE 1

| | 2015-2018 TSV interconnect level | |
|---|---|---|
| | Global layer | Intermediate layer |
| Minimum TSV diameter | 2 μm to 3.5 μm | 0.5 μm to 2 μm |
| Minimum TSV pitch | 4 μm to 7 μm | 1 μm to 4 μm |
| Minimum TSV depth | 30 μm to 50 μm | 5 μm to 20 μm |
| Minimum TSV aspect ratio | 12:1-20:1 | 5:1-20:1 |
| Bonding overlay accuracy | 0.5 μm to 1.0 μm | 0.5 μm to 1.0 μm |
| Minimum contact pitch (thermocompression) | 5 μm | 2 μm to 3 μm |
| Minimum contact pitch (solder bump) | 10 μm | 2 μm to 3 μm |
| Number of die per stack | 2 to 8 | 8 to 16 (Dynamic random access memory, or DRAM) |

After the physical model generating module 501 generates a plurality of physical models, the training sample generating module 503 can generate a group of training samples for each of the physical models to form a training sample group and divide the training sample group into a training set t1 and a testing set t2. Specifically, the training sample generating group 503 can group a group of training samples generated for each type of physical model into a set of training samples having a plurality types of physical model, and can divide the training sample groups into an m number of subsets, wherein an (m−1) number of the subsets are assigned as the training set t1 and the remaining 1 of the subsets is assigned as the testing set t2, and m can be any positive integer.

For instance, in the case that the training sample generating module 503 respectively generates 1000 training samples for physical models of TSVs having 0% void defects and 5% void defects, the training sample generating module 503 can set the value of m to 10, i.e., divide 2000 training samples into 10 equal portions, wherein 1800 training samples can be assigned as the training set t1, and the remaining 200 training samples can be assigned as the testing set t2. It should be mentioned that, the training sample is generated by the training sample generating module 503 based on the same structure parameter group as the corresponding physical model, and therefore each training sample belonging to the same physical model has the same structure parameter group. For instance, in the case that the training sample generating module 503 generates 1000 training samples for the physical model of the TSV having 5% void defects, the 1000 training samples are all TSV physical models having 5% void defects.

The scattering parameter value acquisition module 505 can obtain a group of scattering parameter (S parameter) values corresponding to the training set t1 via the training set t1. Specifically, the scattering parameter value acquisition module 505 can perform a finite element method (FEM) on the training samples in the training set t1 to extract the S parameter values of each training sample to obtain a group of scattering parameter values corresponding to the training set t1, and the S parameter values can be, for instance, scattering parameters such as S11 parameters or S21 parameters. After the scattering parameter value acquisition module 505 obtains a group of scattering parameter values corresponding to the training set t1, the classifier model generating module 507 can generate a classifier model cm via the group of scattering parameter values. Specifically, the classifier model generating module 507 can use a machine learning algorithm for the group of scattering parameter values to generate the classifier model cm corresponding to the group of scattering parameter values. The machine learning algorithm can be, for instance, K nearest neighbor (KNN) algorithm or random forest (RF) algorithm, and can also be, for instance, various types of machine learning algorithms supporting a vector machine, a decision tree, or regression analysis. Moreover, although in the present embodiment, a classifier model is generated based on scattering parameter values, the user can also generate the classifier model using different parameters based on actual requirement, and the invention is not limited in this regard. For instance, the user can also obtain an impedance value of the HFSS structural parameters from the training samples formed by the HFSS structure parameter group and extract a phase angle with the impedance value to generate a corresponding classifier model using the phase angle.

Figure 6:
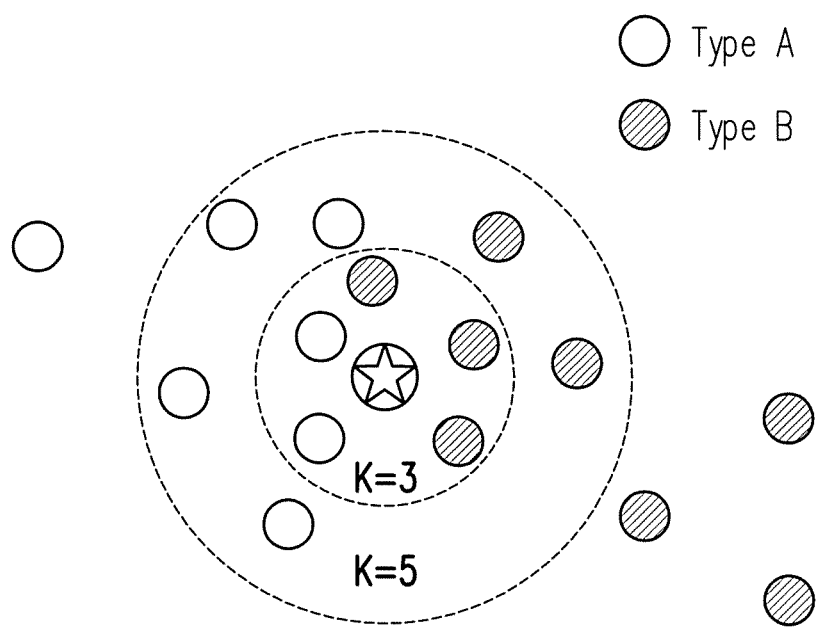
FIG. 6 shows a schematic diagram of a K nearest neighbor algorithm.

FIG. 6 shows a schematic diagram of a K nearest neighbor algorithm. The KNN algorithm is the most basic classification algorithm in machine learning and can find a K number of training samples nearest to the sample to be classified in the training set, and the classification of the object to be classified is decided by the type of the majority of training samples in the K number of nearest neighbors. When K=1, the type of the object to be classified is the type of the nearest training sample. When the KNN algorithm is used, for each sample, the type of the sample can be represented by the type of the K number of neighbors nearest to the sample. In other words, if in the classifier space, then the majority of the K number of samples nearest to a specific sample is type 1, and the specific sample is also type 1 and has the properties of the samples of type 1.

As shown in FIG. 6, when K=3, in the 3 neighboring samples closest to the object to be classified (the star in the middle), samples of type B are the majority, and therefore the object to be classified can be classified as type B. When K=5, in the 5 neighboring samples closest to the object to be classified, samples of type A are the majority, and therefore the object to be classified can be classified as type A. When the difference between two data is determined using KNN algorithm, a Euclidean distance is generally adopted, and a smaller distance indicates a smaller difference between the two data. Based on the above, the KNN algorithm finds the nearest data to the data to be classified based on a currently classified data set, and then determines or predicts the type of the data to be classified based on the type of the nearest data.

In an embodiment of the invention, the classifier model generating module 507 generates the classifier model cm using a KNN algorithm. When the classifier model cm is generated, the classifier model generating module 507 first presets a K value and generates the classifier model cm corresponding to specific defect types based on the preset K value and the training set t1, and the specific defect types can be the defect types and the degrees to which the defect occurs of each training sample in the training set t1. For instance, if each training sample in the training set t1 has 2 different types of defects and the 2 types of defects respectively have 5 differences to varying degrees, then the classifier model cm generated based on the training set t1 can at most differentiate 2*5=10 different defect types.

When a certain sample is classified using the classifier model cm, the classifier model generating module 507 decides the defect type corresponding to the sample to be classified using the K number of training samples in the training set t1 closest to the sample to be classified based on the K value. The method of measuring distance can adopt the Euclidean distance above, and a smaller Euclidean distance between the S parameters corresponding to two samples indicates a smaller difference of two training samples. If each sample is a coordinate point in the n-dimensional space, then the discriminant function of the KNN method is as follows:

Classification($T$)=min$\|T-X_i^c\|$ wherein T is the sample to be classified, $X_i^c$ is the i-th data with defect type c in the classified training sample (i.e., the training set t1), and i=1, 2, . . . , n (dimension of the training sample). In the KKN algorithm, the selection of the K value significantly affects the result, and a large K value can reduce the effect of noise on classification. The most preferred K value can generally be selected using a cross validation method. In the present specification, embodiments of cross validation are described later.

Figure 7:
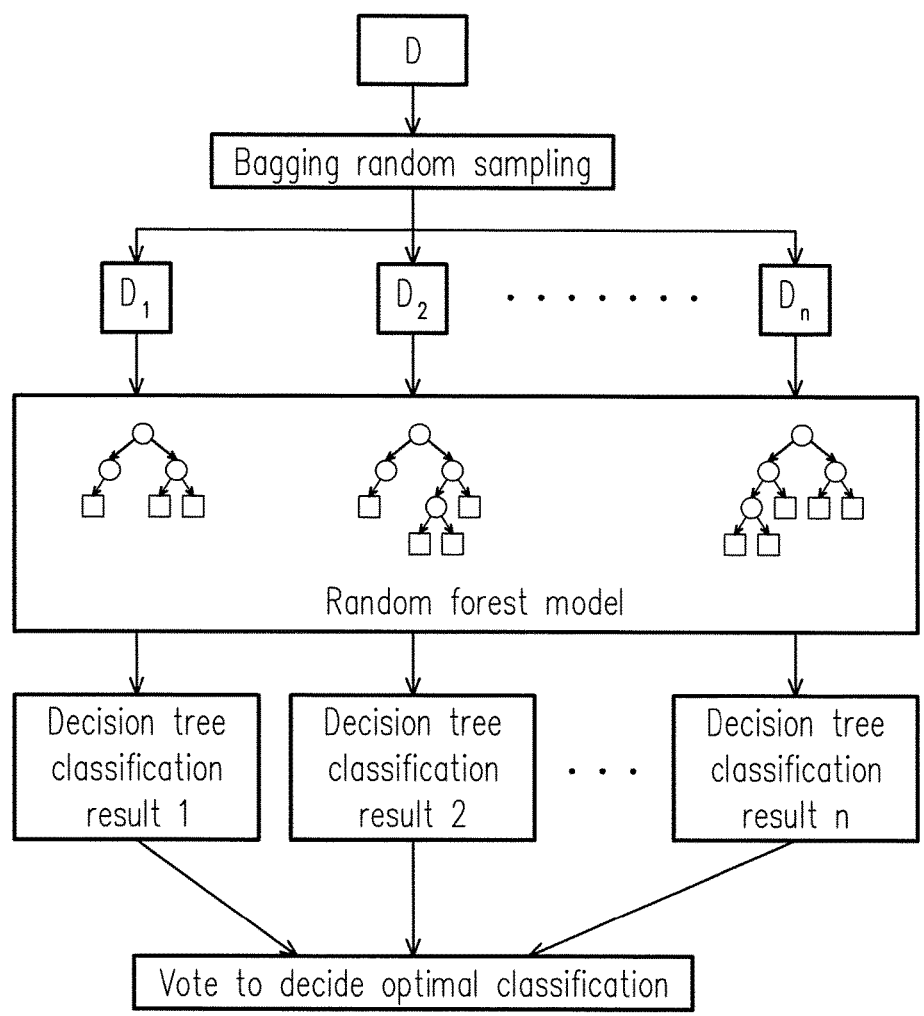
FIG. 7 shows a schematic diagram of a random forest algorithm.

FIG. 7 shows a schematic diagram of a random forest algorithm. Random forest is a classifier containing a plurality of decision trees as the basis and a combined classification model $\{h(X,\theta_j); j=1, \ldots\}$ formed by many decision tree classification models, wherein $\{\theta_j\}$ is an independently distributed random vector, and when X is inputted, each tree only provides one vote for the most suitable classification. First, an n number of subsets such as a subset D1, a subset D2, . . . , a subset Dn shown in FIG. 7 are randomly chosen from an original training data set D using bagging sample selection, and the sample size of each subset is the same. Next, an n number of decision tree models are respectively generated for an n number of subsets to obtain an n number of classification results. Lastly, each record is voted based on the n number of classification results to decide the final classification. The final prediction result is decided by the vote of the prediction result of each decision tree such that the classification with the most votes is used as the final prediction result.

In an embodiment of the invention, the classifier model generating module 508 generates the classifier model cm using a random forest algorithm. When the classifier model cm is generated, the classifier model generating module 507 first randomly selects an n number of subsets in the training set t1, and the size of each subset is the same, that is, the number of training samples in each subset is the same. Next, the classifier model generating module 507 respectively generates corresponding decision trees for each subset (i.e., a total of n number of decision trees), and then the classifier model generating module 507 can generate the classifier model cm corresponding to specific defect types via the n number of decision trees, and the specific defect types can be the defect types and the degrees to which the defect occurs of each training sample in the training set t1. For instance, if each training sample in the training set t1 has a total of 2 different types of defects, and the 2 types of defects respectively have 5 differences to varying degrees, then the classifier model cm generated based on the training set t1 can at most differentiate 2*5=10 types of different defect types.

After the classifier model cm is generated, the defect model generating module 509 can measure the error of the classifier model cm using the training set t2 to calculate an error value e1 and decide the use of the classifier model cm based on the error value e1 as the defect model of the specific defect types to determine whether the single die 3D chip or the stacked die 3D chip has the defect corresponding to the above specific defect types. Specifically, the defect model generating module 509 can input each training sample in the testing set t2 into the classifier model cm, and determines which types of defect each training sample respectively has via the classifier model cm, or can further determine the degrees of the defect in each training sample via the classifier model cm. After each training sample in the testing set t2 is classified by the classifier model cm, the defect model generating module 509 can compare the classification result of each training sample with the defect types or defect degrees actually corresponding to the training sample and determine whether the classification result of each training sample meets the defect types actually corresponding to the training sample to measure the error value e1 during the classification of the testing set t2 using the classifier model cm.

After the error value e1 is obtained, the defect model generating module 509 can determine whether the classifier model cm is used as a defect model (also referred to as a classifier) of specific defect types based on the error value e1 to use the defect model to determine whether the 3D chip has a defect of specific defect types, wherein the specific defect types can be the defect types or the degrees to which the defect occurs of each training sample in the training set t1.

For instance, an error value e1 less than a preset threshold indicates the accuracy of classifying the testing set t2 using the classifier model cm reached the expected standard, and at this point, the defect model generating module 509 can use the classifier model cm as the defect model. After the defect model is generated, whether the chip to be detected has a defect meeting the specific defect type can be determined by the defect model just by inputting the S parameter of a single die 3D chip or a stacked die 3D chip to be detected into the defect model.

To validate the accuracy of the defect model, the defect detection system 500 can also repeatedly check the defect model using the training samples generated by the training sample generating module 503. Specifically, After the defect model generating module 509 measures the error value e1 of the classifier model cm using the testing set t2, the training sample generating module 503 can select 1 subset from an m number of subsets of the training sample again as a new testing set t2', and the remaining (m−1) number of subsets are new training sets t1', wherein the subsets forming the new testing set t2' and all of the subsets forming the previous testing set (such as the testing set t2) are different. In other words, the subsets that have been the testing set cannot be reused as the new testing set.

After the training sample generating module 503 generates the new training set t1' and the new training set t2', the scattering parameter value acquisition module 505 can obtain a group of scattering parameter values corresponding to the training set t1' via the training set t1'. Next, the classifier model generating module 507 can generate a new classifier model cm' via the group of scattering parameter values. After the classifier model generating module 507 generates the new classifier model cm', the defect model generating module 509 can measure the new classifier model cm' using the new testing set t2' to obtain a new error value e2. The detailed methods of obtaining a group of scattering parameter values, generating a classifier model, and measuring and obtaining an error value are all disclosed in the embodiments above and are therefore not repeated herein.

After the steps above, the classifier model generating module 507 can respectively generate the classifier model cm and the classifier model cm' using the same classifier model generating method and using the same training sample but different training sets t1 and t1', and the defect model generating module 509 can respectively measure the error values e1 and e2 of the classifier model cm and the classifier model cm' using the same training sample but different testing sets t2 and t2'. In the present embodiment, the defect detection system 500 can repeat the step of generating a new classifier model and the step of measuring the new error values (m−1) times until each subset in the m number of subsets of the training sample has been the testing set. Accordingly, the defect model generating module 509 can obtain a total of an m number of error values.

After the defect model generating module 509 obtains the m number of error values, the defect model generating module 509 can calculate and measure the average error value of the m number of error values, and the defect model generating module 509 can decide whether to use the classifier model cm as the defect model of specific defect types based on the average error value, wherein the specific defect types can be the defect types or the degrees to which the defect occurs of each training sample in the training set t1. Specifically, after performing the step of generating a new classifier model and the step of measuring the new error values m times, the defect detection system 500 can generate the remaining (m−1) number of classifier models using the same training sample group and using the same generating method as the classifier model cm and measure the error values (a total of m error values) corresponding to each classifier model. If the average error value calculated from an m number of error values is less than a preset threshold, then the accuracy of the classifier model generated using the same generating method as the classifier model cm can reach the expected standard. Accordingly, the defect model generating module 509 can decide to use the classifier model cm as the defect model based on a low average error value. More specifically, the defect model generating module 509 can also select a classifier model (such as the classifier model cm') generated by the same generating method as the classifier model cm as the defect model.

The method above of using the same training sample group to generate and check the classifier model is referred to as m-fold cross validation and has the following advantages. First, the method can obtain as much effective information as possible from limited learning data. Next, the cross validation method can validate the classifier model from a plurality of directions to effectively avoid falling into local minimum. Moreover, the issue of overfitting can be avoided to a certain degree.

Figure 8A:
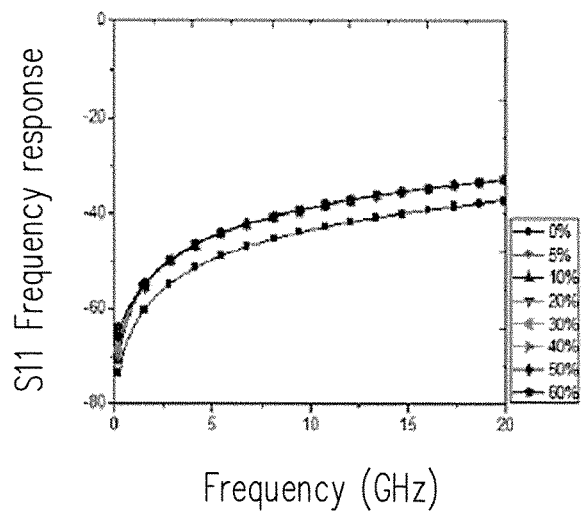
FIGS. 8A and 8B respectively show frequency response graphs of S11 and S21 parameters of HFSS simulation of single die 3D chip TSV void defect percentages according to an embodiment of the invention.
Figure 8B:
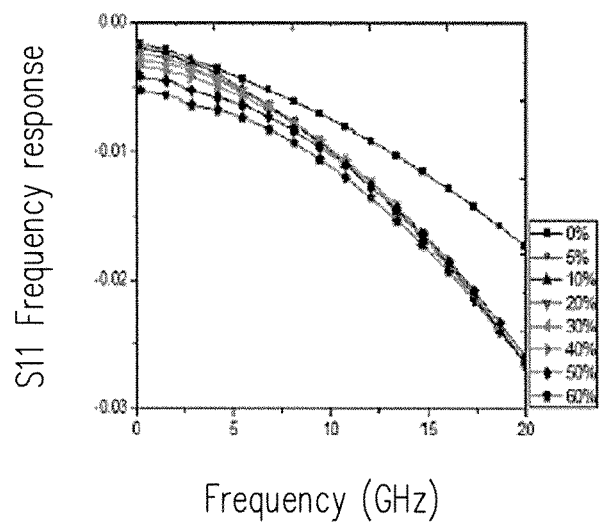

The results of the HFSS simulation of the S11 parameter and the S21 parameter frequency responses for different signal transmission frequencies and 3D chip TSV void defect percentages are as shown in FIGS. 8A and 8B and FIGS. 8C and 8D. First, FIGS. 8A and 8B respectively show frequency response graphs of S11 and S21 parameters of HFSS simulation of single die 3D chip TSV void percentages according to an embodiment of the invention. These graphs reflect the frequency response of the single die 3D chip TSV void defect percentage between the frequencies of 200 MHz and 20 GHz. The S11 parameter is used to measure the return loss of the signal, and a lower S11 parameter value indicates a lower return loss of the signal. The presence of void defects causes the incident RF signal to be absorbed or scattered. As shown in FIG. 8A, the frequency response curve (curve labeled by squares) of a single die 3D chip representing a void defect percentage of 0 has the minimum S11 parameter value. Moreover, it can be known from FIG. 8A that, lesser void defects present in the TSV indicates smaller return loss of the single die 3D chip. The S21 parameter is used to measure the insertion loss of the signal, and a higher S21 parameter value indicates a smaller insertion loss of the signal. As shown in FIG. 8B, the frequency response curve (curve labeled by squares) of a single die 3D chip representing a void defect percentage of 0 has the maximum S21 parameter value, and therefore it can be known from FIG. 8B that, lesser void defects present in the TSV indicates smaller insertion loss of the single die 3D chip.

Figure 8C:
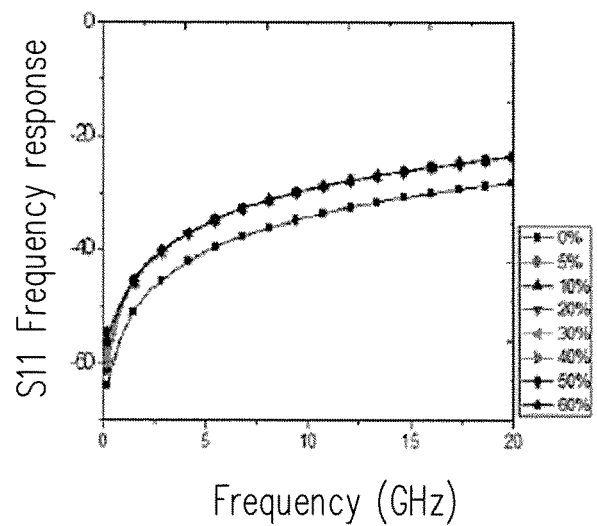
FIGS. 8C and 8D respectively show frequency response graphs of S11 and S21 parameters of HFSS simulation of stacked die 3D chip TSV void defect percentages according to an embodiment of the invention.
Figure 8D:
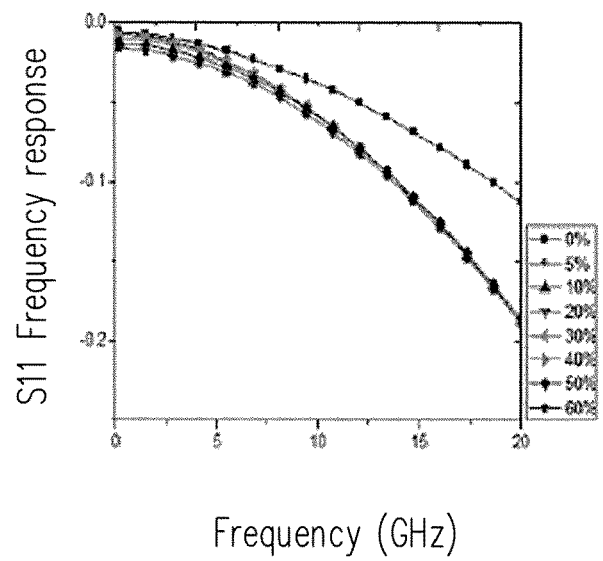

FIGS. 8C and 8D respectively show frequency response graphs of S11 and S21 parameters of HFSS simulation of stacked die 3D chip TSV void percentages according to an embodiment of the invention. These graphs reflect the frequency response of the stacked die 3D chip TSV void defect percentage between the frequencies of 200 MHz and 20 GHz. Although FIG. 8C and FIG. 8D simulate the TSV void defect of the stacked die 3D chip, in the present embodiment, the simulation results of the single die 3D chip and the stacked die 3D chip are substantially the same. As shown in FIG. 8C, the frequency response curve (curve labeled by squares) of a stacked die 3D chip representing a void defect percentage of 0 has the minimum S11 parameter value, and therefore it can be known from FIG. 8C that, lesser void defects present in the TSV indicates smaller return loss of the stacked die 3D chip. Similarly, as shown in FIG. 8D, the frequency response curve (curve labeled by squares) of a stacked die 3D chip representing a void defect percentage of 0 has the maximum S21 parameter value. Moreover, it can be known from FIG. 8D that, lesser void defects present in the TSV indicates smaller insertion loss of the stacked die 3D chip.

Figure 9:
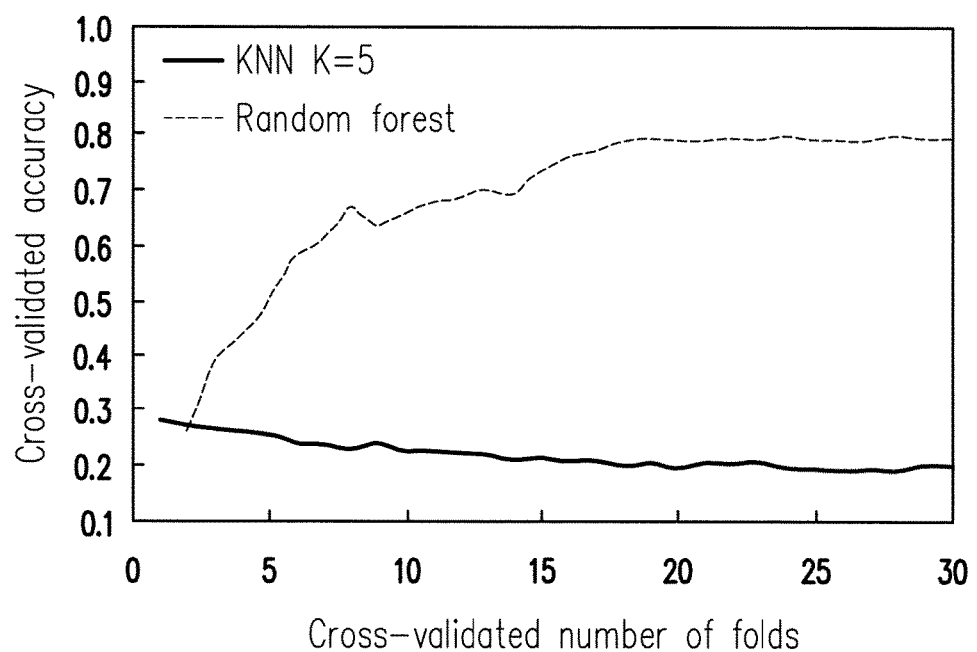
FIG. 9 shows a schematic diagram of performance comparison of a stacked die 3D chip void detection KNN and RF algorithms classifier model according to an embodiment of the invention.

FIG. 9 shows a schematic diagram of performance comparison of a stacked die 3D chip void detection KNN and RF algorithms classifier model according to an embodiment of the invention. In the embodiment of FIG. 9, the KNN algorithm compares performances with K=5 and random forest algorithm. Since the TSV is a device having capacitance characteristics, the TSV has the classifier of different frequency responses for different frequency ranges. It can be seen from FIG. 8 that, a higher frequency indicates smaller variance of the scattering parameters S11 and S21, which is caused by reduced resistance of series capacitance triggered by disconnection at a higher frequency.

M-fold cross validation KNN and random forest (RF) algorithm are implemented to generate a defect model to detect the performance of the stacked die 3D chip void defect detection result, which shows the RF classifier model can reach an accuracy of 80%. Since the KNN algorithm is an ad-hoc classifier used to classify testing data based on distance measurement, when the KNN algorithm decides the classification, the KNN algorithm is only related to a very small number of adjacent samples and adopts the same weights, and the performance of the results of type differentiation of the currently collected data characteristics is less than expected. For the current training data, the KNN algorithm shows that an increase in K value reduces the accuracy of classification. Specifically, the random forest algorithm has the following features: can be effectively performed on large data sets; can process input samples having high dimensional classifier without reducing dimension; can evaluate the importance of each characteristic in classification; and can obtain an unbiased estimate of internal generation errors in the generation process. The experimental results also show that the overall accuracy of the random forest algorithm is better than the KNN algorithm. Moreover, the accuracy of the random forest algorithm is increased with increased number of folds. Although the accuracy is increased with the number of folds, the accuracy starts to level at around 20 folds.

Figure 10:
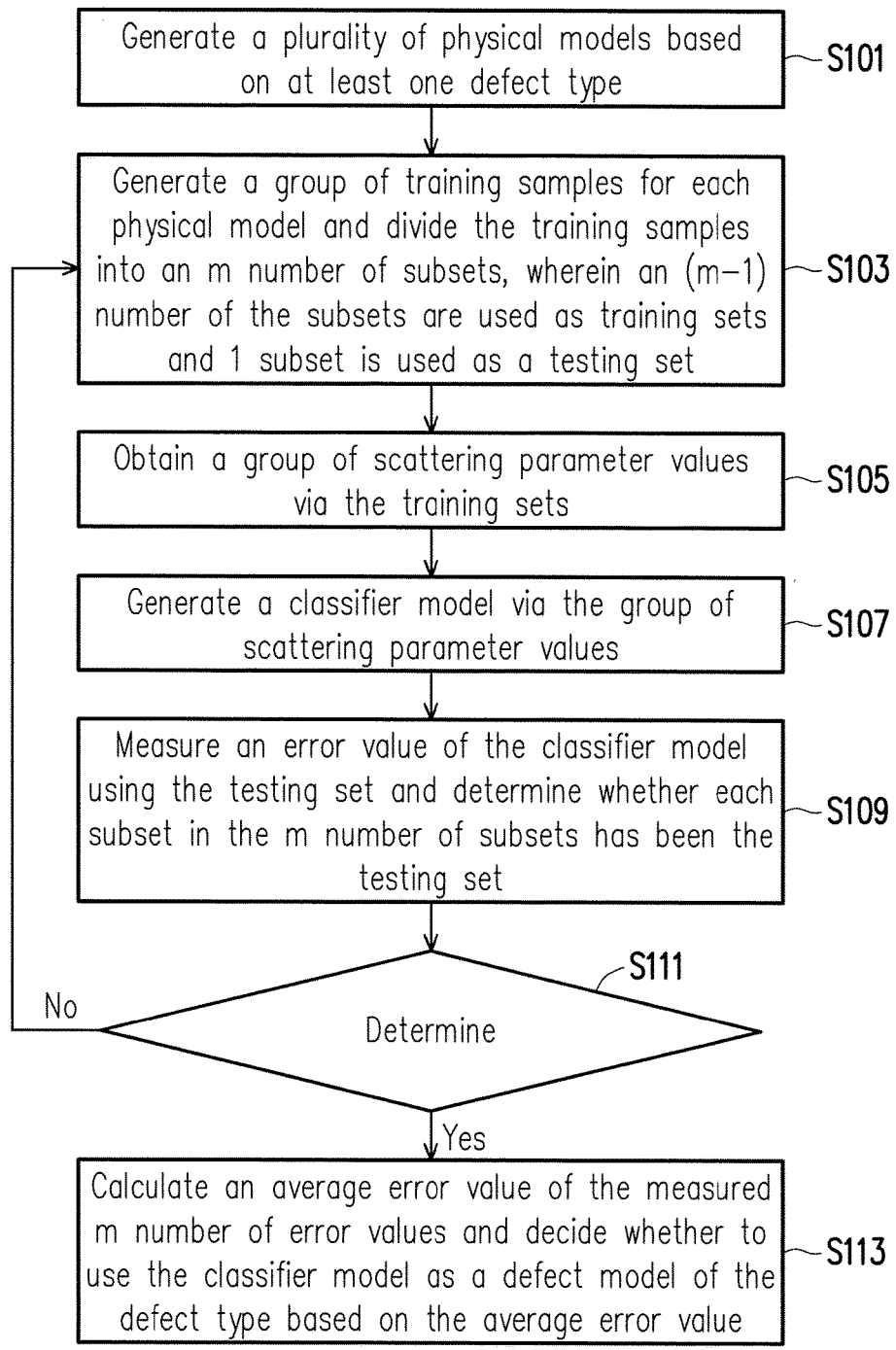
FIG. 10 shows a defect detection method for a single die 3D chip and a stacked die 3D chip according to an embodiment of the invention.

FIG. 10 shows a defect detection method for a single die 3D chip and a stacked die 3D chip according to an embodiment of the invention. This method is implemented by the defect detection system 500 disclosed by the invention. In step S101, a plurality of physical models having a defect of at least one defect type is generated based on the at least one defect type of a 3D chip, and then step S103 is performed. In step S103, a group of training samples is generated for each of the physical models to form a training sample group and divide the training sample groups into an m number of subsets, wherein an (m−1) number of the subsets are assigned as the training set t1 and the remaining 1 of the subsets is assigned as the testing set t2, and m can be any positive integer. Next, step S105 is performed. In step S105, a group of scattering parameter values corresponding to the training set t1 is obtained via the training set t1. Next, step S107 is performed. In step S107, the classifier model cm is generated via the group of scattering parameter values. Next, step S109 is performed. In step S109, the error value e1 of the classifier model cm is measured using the testing set t2 and whether each subset in the m number of subsets has been the testing set is determined. Next, step S111 is performed.

In step S111, if the result is no, then there are still subsets in the m number of subsets that have not been the testing set, and then step S103 is repeated to reassign the (m−1) number of the subsets as a new training set and assign the remaining 1 of the subsets as a new testing set, wherein the subset forming the new testing set and the subsets forming all of the previous testing sets are different. If the result is yes, then each subset in the m number of subsets has been the testing set. In other words, an m number of classifier models is generated using an m number of different training sets, and then step S113 is performed. In step S113, the error values of the classifier model corresponding to the testing set are measured using the testing set. It should be mentioned that, the step of measuring the error values of each classifier model can be performed at the same time after the m number of classifier models are generated, and the error values of the classifier model can also be instantly measured after each classifier model is generated, and the invention is not limited in this regard. Next, an average error value is calculated using an m number of error values and whether the classifier model cm is used as a defect model of the at least one defect type based on the average error value to determine that a TSV of a single die 3D chip or a stacked die 3D chip has a defect corresponding to the at least one defect type.

Based on the above, the invention provides a defect detection method for a 3D chip and a system using the same that can extract S parameter values under a plurality of different physical models via finite element analysis from generated physical models and use the S parameter values corresponding to a single die TSV or a stacked die TSV as the training set for machine learning before or after 3D chip stacking. By comparing the S parameter values of the 3D chips and the classifier models generated based on the training sets, in the invention, a 3D chip can be classified based on different defect types without performing an additional Design-For-Test circuit design and without sample preparing for observing the presence of defects. As a result, in addition to achieving the object of non-destructive detection, the collection and measurement or simulation of data plus training can further achieve the effects of reduced detection time and costs, such that the quality of the 3D chip is ensured, and the production process can be speeded up.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A defect detection method for a single die 3D chip and a stacked die 3D chip, comprising:
   generating a plurality of physical models having a defect of at least one defect type based on the at least one defect type of a 3D chip;
   generating a group of training samples for each of the physical models to form a training sample group and dividing the training sample group into a training set and a testing set;
   obtaining a group of scattering parameter values corresponding to the training set via the training set;
   generating a classifier model via the group of scattering parameter values;
   measuring an error value of the classifier model using the testing set and using the classifier model as a defect model of the at least one defect type based on the error value; and
   inputting, to the classifier model, at least one scattering parameter value of the single die 3D chip or the stacked die 3D chip to be detected so as to determine that Through Silicon Via of the single die 3D chip or the stacked die 3D chip has a determined defect corresponding to the at least one defect type, wherein
   the single die 3D chip or the stacked die 3D chip has been having the determined defect corresponding to the at least one defect type since being manufactured; and
   all steps of the defect detection method are implemented by a processor.

2. The defect detection method of claim 1, wherein the step of "generating the group of training samples for each of the physical models to form the training sample group and dividing the training sample group into the training set and the testing set" further comprises:
   dividing the training sample group into an m number of subsets, wherein an (m−1) number of the subsets are assigned as the training set and the remaining 1 of the subsets is assigned as the testing set, wherein in is any positive integer.

3. The defect detection method of claim 2, wherein the step of "measuring the error value of the classifier model using the testing set and using the classifier model as the defect model of the at least one defect type based on the error value" further comprises:
   reassigning the (m−1) number of the subsets as a new training set and assigning the remaining 1 of the subsets as a new testing set after the error value of the classifier model is measured, wherein the subset forming the new testing set and the subset forming the previous testing set are different;
   generating a new classifier model and measuring a new error value of the new classifier model based on the new training set and the new testing set;
   repeating the step of generating the new classifier model and the step of measuring the new error value (m−1) times until each of the subsets in the m number of subsets has been the testing set; and
   calculating an average error value of the measured m number of error values and deciding whether to use the classifier model as the defect model of the at least one defect type based on the average error value.

4. The defect detection method of claim 1, wherein the step of "generating the plurality of physical models having the defect of the at least one defect type based on the at least one defect type of the 3D chip" comprises:
   generating the plurality of physical models using a high frequency structure simulator (HFSS) based on a structure parameter group, wherein the structure parameter group comprises at least one parameter of a Through Silicon Via (TSV) diameter, a TSV pitch, a TSV depth, a TSV aspect ratio, an underfill height, a relative permittivity of an underfill, a bonding overlay accuracy, a contact pitch when a thermocompression is used, a contact pitch when a solder bump is used, a bump diameter, a bump height, a number of die per stack, an bottom silicon dioxide thickness, and a TSV insulator thickness.

5. The defect detection method of claim 4, wherein the group of training samples is generated based on a same structure parameter group as the physical model.

6. The defect detection method of claim 1, wherein the step of "obtaining the group of scattering parameter values corresponding to the training set via the training set" comprises:
   obtaining the group of scattering parameter values corresponding to the training set via a finite element method (FEM).

7. The defect detection method of claim 1, wherein the step of "generating the classifier model via the group of scattering parameter values" comprises:
   using one of a K nearest neighbor (KNN) algorithm and a random forest (RF) algorithm on the group of scattering parameter values to generate the classifier model.

8. The defect detection method of claim 1, wherein components of the at least one defect type comprise: a 3D chip defect caused by a TSV technique, and the defect comprises at least one defect of a void, a pinhole, a bump crack, and an open fault.

9. A defect detection system for a single die 3D chip and a stacked die 3D chip, comprising:
   a processor configured to control:
   a physical model generating module, the physical model generating module generating a plurality of physical models having a defect of at least one defect type based on the at least one defect type of a 3D chip;
   a training sample generating module, the training sample generating module generating a group of training samples for each of the physical models to form a training sample group and dividing the training sample group into a training set and a testing set;
   a scattering parameter value acquisition module, the scattering parameter value acquisition module obtaining a group of scattering parameter values corresponding to the training set via the training set;
   a classifier model generating module, the classifier model generating module generating a classifier model via the group of scattering parameter values; and
   a defect model generating module, the defect model generating module measuring an error value of the classifier model using the testing set and using the classifier model as a defect model of the at least one defect type based on the error value and inputting, to the classifier model, at least one scattering parameter value of the single die 3D chip or the stacked die 3D chip to be detected so as to determine that Through Silicon Via of the single die 3D chip or the stacked die 3D chip has a determined defect corresponding to the at least one defect type,
wherein the single die 3D chip or the stacked die 3D chip has been having the determined defect corresponding to the at least one defect type since being manufactured.

10. The defect detection system of claim 9, wherein the training sample generating module further divides the training sample group into an m number of subsets, wherein an (m−1) number of the subsets are assigned as the training set and the remaining 1 of the subsets is assigned as the testing set, wherein m is any positive integer.

11. The defect detection system of claim 10, wherein the defect model generating module is further configured to:
reassigning the (m−1) number of the subsets as a new training set and assigning the remaining 1 of the subsets as a new testing set via the training sample generating module after the defect model generating module measures the error value of the classifier model, wherein the subset forming the new testing set and the subset forming the previous testing set are different;
generating a new classifier model via the classifier model generating module and measuring a new error value of the new classifier model via the defect model generating module based on the new training set and the new testing set;
repeating the step of generating the new classifier model and the step of measuring the new error value by an (m−1) number of times via the system until each of the subsets in the m number of subsets has been the testing set; and
calculating an average error value of the measured m number of error values via the defect model generating module and the defect model generating module decides whether to use the classifier model as the defect model of the at least one defect type based on the average error value.

12. The defect detection system of claim 9, wherein the physical model generating module further generates the plurality of physical models using a high frequency structure simulator (HFSS) in the physical model generating module based on a structure parameter group, wherein the structure parameter group comprises at least one parameter of a TSV diameter, a TSV pitch, a TSV depth, a TSV aspect ratio, an underfill height, a relative permittivity of an underfill, a bonding overlay accuracy, a contact pitch when a thermocompression is used, a contact pitch when a solder bump is used, a bump diameter, a bump height, a number of die per stack, an bottom silicon dioxide thickness, and a TSV insulator thickness.

13. The defect detection system of claim 12, wherein the group of training samples is generated by the training sample generating module based on a same structure parameter group as the physical model.

14. The defect detection system of claim 9, wherein the scattering parameter value acquisition module further obtains the group of scattering parameter values corresponding to the training set via a finite element method (FEM).

15. The defect detection system of claim 9, wherein the classifier model generating module further uses one of a K nearest neighbor (KNN) algorithm and a random forest (RF) algorithm on the group of scattering parameter values to generate the classifier model.

16. The defect detection system of claim 9, wherein components of the at least one defect type comprise: a 3D chip defect caused by a TSV technique, and the defect comprises at least one defect of a void, a pinhole, a bump crack, and an open fault.

* * * * *